Feb. 2, 1971 L. J. MONTONE 3,560,093

SUPERIMPOSED COMMON CARRIER MASK INSPECTION SYSTEM

Filed July 16, 1968 4 Sheets-Sheet 1

INVENTOR
L. J. MONTONE
By R. P. Miller
ATTORNEY

Feb. 2, 1971 L. J. MONTONE 3,560,093

SUPERIMPOSED COMMON CARRIER MASK INSPECTION SYSTEM

Filed July 16, 1968 4 Sheets-Sheet 4

United States Patent Office 3,560,093

Patented Feb. 2, 1971

3,560,093

SUPERIMPOSED COMMON CARRIER MASK INSPECTION SYSTEM

Liber J. Montone, Reading, Pa., assignor to Western Electric Company, Incorporated, New York, N.Y., a corporation of New York Filed July 16, 1968, Ser. No. 745,232
Int. Cl. G01b *9/08, 11/24*
U.S. Cl. 356—166 11 Claims

ABSTRACT OF THE DISCLOSURE

A system in which the positions of the opaque areas on the surface of a first transparent photographic mask are compared to the positions of the opaque areas on the surface of a second transparent photographic mask. The two mask surfaces are placed face to face and separated by a layer of material possessing the characteristics of a "one-way" mirror. A single television camera, focused on the adjacent mask surfaces, views the two masks which are alternately illuminated from above and below. When illuminated from below, light is transmitted through both masks and the "mirror," and images of the opaque areas on both masks appear on a monitor. When illuminated from above, the "mirror" reflects light and only the image of the opaque areas on the upper mask appears on the monitor. A "flicker effect," or other visual differential detection system, indicates the degree of deviation of the positions of the opaque areas on the first mask from the second mask.

BACKGROUND OF THE INVENTION

(1) Field of the invention

The invention relates to the inspection of indicia bearing media, e.g., photographic masks, comprising transparent glass substrates having precisely defined patterns of opaque areas thereon, by comparison to standard masks of known precision. A number of different manufacturing steps commonly employed in the production of semiconductor components, such as integrated circuits, require the formation of a photoresist pattern on the surface of a wafer of semiconductive material. Such patterns are formed by applying a layer of photoresist material to the surface of the wafer, placing a photographic mask over the layer of photoresist, and exposing the layer to ultraviolet light through the mask. The opaque areas on the mask shields selected areas of the photoresist from exposure to the ultraviolet light so that when the layer of photoresist is photographically developed, the shielded areas are removed to expose selected areas of the wafer surface. This process permits chemical treatment of the exposed areas of the wafer, such as etching or diffusion, without affecting other areas of the wafer.

Because it is necessary to occasionally replace a damaged mask with a substitute, every mask must be as exactly alike as possible. In order to maintain the standard of precision which is required in semiconductor manufacture, it is necessary to check each mask to be used with a standard mask of known exactness. Checking is performed by measuring the conformity of the pattern of opaque areas, or "dots," on each mask to be used in manufacture with the pattern on a standard mask. Because of the great precision which is required, .000050 inch over a span of 1–4 inches, conventional mechanical measuring techniques are slow, costly and ineffective.

(2) Description of prior art

In the past, one well-known technique for comparing masks contemplated that the masks be individually viewed with a toolmaker's microscope and the location of opaque areas noted by observing the reading on a micrometer which advances the mask through the field of the microscope.

Another solution to the problem of mask inspection has been to view the test and standard masks through two separate television cameras and alternately display the images on a monitor for comparison by a "flicker" technique. However, the use of two separate optical systems for the two masks which are physically separated from one another may introduce error into the system due to optical misalignment, vibration or material expansion due to temperature variations.

SUMMARY OF THE INVENTION

In one embodiment of the invention, a first optical display is generated to indicate the position of a first object. A second optical display is generated of a composite of the first object and of a second object in which the image of the first object occupies the same position in the second display as it does in the first display. The first and second displays are alternately interrupted at a preselected rate to present a flicker effect to indicate the relationship of the position of the second object to the position of the first object.

DESCRIPTION OF THE DRAWING

The nature of the present invention and its various advantages will appear more fully by referring to the following detailed description in conjunction with the appended drawing, in which.

DETAILED DESCRIPTION

Figure 1:
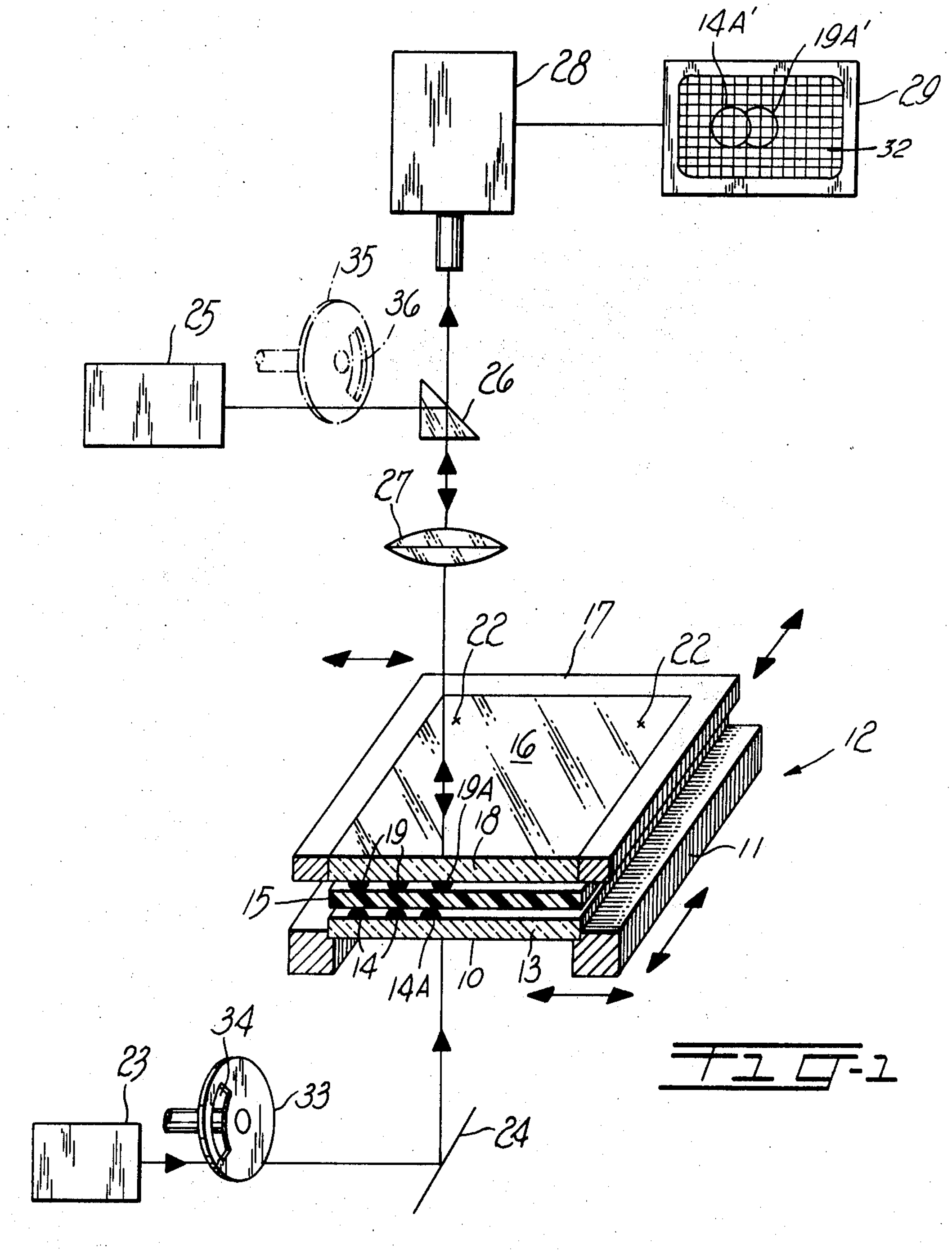
FIG. 1 is a diagrammatic view of a system for inspecting a symmetrical mask, constructed in accordance with the invention.

Referring to FIG. 1 an indicia or pattern bearing media, e.g., a standard mask 10 is mounted within a lower frame 11 of a movable stage 12. The standard mask 10 comprises a transparent glass substrate 13 having a plurality of objects such as opaque areas or "spots" 14 disposed upon one surface to form a pattern. The position of the "spots" 14 on the standard mask 10 are very precisely located and the mask has been previously carefully inspected to insure that the position of each "spot" is exactly that which is desired, within a preselected tolerance. It is to be understood that the term "spots" and the circular configuration shown in FIG. 1 is purely illustrative. Many other patterns of opaque areas might be placed on the surfaces of the photographic masks by photographic, etching or other techniques well known in the mask making art.

A thin layer of light selective material 15 having a large upper surface reflectivity coefficient is placed over the surface of the standard mask 10. The light selective material 15 may be composed of a substance, such as polyethyleneterephthalate, sold under the trade name "Mylar." Other materials which readily pass light when it impinges upon one surface but which reflect a substantial portion of the light when it impinges upon the opposite surface and which are, in effect, "one-way mirrors" may be used. The important factor is that the material be highly reflective to light impinging upon the surface of the material adjacent the viewer and yet relatively transparent to light impinging upon the opposite surface.

A symmetrical indicia bearing medium, e.g., a "test mask" 16, which is to be inspected prior to ultimate use, is mounted within an upper frame 17 of the movable stage 12. The mask 16 is also comprised of a glass substrate 18 having a plurality of opaque areas or "spots" 19 disposed upon its surface. The mask 16 is symmetrical in that the pattern of opaque areas 19 is the same when viewed from either side of the mask. The upper frame 17 is attached to the lower frame 11 so that the patterned surface of the standard mask 10, having opaque areas thereon, is adjacent the patterned surface of the test mask 16. The patterned surfaces of the two masks are separated only by the layer of light selective material 15. Each of the two masks 10 and 16 have alignment marks 22—22 precisely located upon their surfaces and the upper and lower frames 17 and 11 are positioned so that the marks 22—22, and hence, the respective patterns, are in exact alignment. Since the patterns of opaque areas on the two masks are ideally identical, for every spot upon the surface of the standard mask 10, there should be a spot upon the surface of the test mask 16 which is in exact alignment on the opposite side of the layer of light selective material 15. The present inspection system will detect any misalignment between corresponding spots on the surfaces of the two masks.

Beneath the movable stage 12, a lower light source 23 is arranged to direct a beam of light onto the surface of a mirror 24 which reflects the light up through the undersurfaces of the two superimposed masks 10 and 16. An upper light source 25 directs a beam of light onto a half-silvered prism 26 which, in turn, reflects the beam down through an objective lens 27 onto the upper surfaces of the two superimposed masks 16 and 10. A monochromatic television camera 28 is mounted above the movable stage 12 to view the superimposed masks 16 and 10 through a transparent path in the half-silvered prism 26. The television camera 28 is connected to a monitor 29 to display upon the viewing screen the image seen by the camera.

A grid pattern 32, which may comprise a ruled sheet of transparent plastic, is placed over the display screen of the monitor 29. The grid enables the operator to gage distances on the video image.

A first light chopping disc 33 is interposed between the lower light source 23 and the mirror 24. As the disc 33 is rotated at a preselected speed, a slot 34 in the surface of the disc permits a beam of light to pass from the source 23 to the mirror 24 during a portion of a revolution, while the opaque surface of the disc 33 blocks the light beam during the remainder of the cycle of revolution. A second light chopping disc 35 may be provided between the upper light source 25 and the prism 26. The second disc 35 functions in the same manner as the first disc 33, discussed above, except that a slot 36 formed in the surface of the disc 35 is located diametrically opposed to the slot 34 in the disc 33. The second disc 35 is synchronized in rotation with the first disc 33 so that the upper beam is always blocked while the lower beam is passing through the slot 34. Likewise, the lower beam is always blocked while the upper beam is passing through the slot 36. The second light chopping disc 35 is optional and may not be necessary in certain cases, as will be explained below. Further, it is to be understood that the light chopping discs 33 and 35 are purely illustrative and any other means of interrupting the light beams from the sources 23 and 25 in a timed relationship may be used.

In operation, the test mask 16 is placed over the standard mask 10, separated by the layer of light selective material 15, and the alignment marks 22—22 on the surfaces of the two masks are used to bring the patterns into initial alignment. The lower frame 11 and the upper frame 17 are then clamped together to hold the test mask 16 and the standard mask 13 in their initially aligned position. The movable stage 12 is then shifted in the X and Y directions (by means not shown) so that a selected area on the two masks is in alignment with the optical path of the television camera 28. Two superimposed opaque areas 14A and 19A on the standard mask 10 and the test mask 16, respectively, are then in alignment with the camera 28. The camera 28 is focused upon the layer of light selective material 15 and, since the patterned surfaces of the two masks are contiguous to opposite faces of the layer 15, the camera will also be focused to a good approximation, upon both the opaque areas 14A and 19A.

The lower light source 23 and the upper light source 25 are energized and the lower chopping disc 33 and the upper chopping disc 35 are set into rotation. When the superimposed masks are illustrated by the lower light source 23, through the slot 34 in the lower chopping disc 33, the light passes up through the standard mask 10, the light selective material 15 and the test mask 16 so that the superimposed masks are illuminated by the lower light source 23, through the slot 34 in the lower chopping disc 33, the light passes up through the standard mask 10, the light selective material 15 and the test mask 16 so that the superimposed image of both the opaque area 14A and the opaque area 19A appear on the screen of the television monitor 29. If there is misalignment in the two opaque areas 14A and 19A their image will appear on the screen as two misaligned images 14A' and 19A'. When the superimposed masks are illuminated by the upper light source 25, through the slot 36 in the upper chopping disc 35, and light from the lower source 23 is blocked by the opaque surface of the lower chopping disc 33, the light passes down through the test mask 16 onto the surface of the light selective material 15. When illuminated from above the light selective material 15 reflects the major portion of the incident illumination back up through the test mask 16 so that the only image visible to the camera 28 is that of the opaque area 19A on the test mask 16. That is, when the superimposed masks are illuminated from above, the layer of light selective material 15 prevents enough illumination from reaching the standard mask 10 that the opaque area 14A, the surface thereof, is not visible to the camera 28. When illuminated from above, only the opaque area 19A is viewed by the camera 28 so that only the image 19A' appears on the screen of the monitor 29.

The upper and lower chopping discs 35 and 33 are rotated in synchronization so that the superimposed masks are alternately illuminated, in rapid succession at a preselected rate, from above and below. This alternation of illumination results in an image in the optical path of the television camera 28 of first, both the opaque area 14A and the opaque area 19A, and second, the opaque area 19A alone. The image of the area 19A will occupy the same position on the monitor screen when it is displayed alone as when it is displayed as a composite image along with area 14A. If the opaque areas 14A and 19A are in exact alignment, as they should be if the test mask 16 is perfect, the images of both 14A' and 19A' will appear in exact alignment on the screen of the television monitor 29. As a result, there will be no visible change in the displayed image when only 19A' is displayed than when both 14A' and 19A' are displayed. However, if the opaque areas 14A and 19A are misaligned, there will be a visible change or "flicker effect" as the monitor 29 alternately switches from displaying the combined images 14A' and 19A' to displaying the single image 19A'. The rate of alternation of illumination is chosen such that "flicker" is clearly apparent to the human eye. The degree of flicker will readily indicate to the operator the degree of misalignment in the opaque areas. The grid pattern 32 superimposed upon the screen of the monitor 29 enables the operator to make a judgment as to whether the degree of misalignment is within certain predetermined tolerances.

In the system shown in FIG. 1 the upper light chopping disc 35 optional, in that, when light passes from the lower source 23 up through the two superimposed masks it "washes out" the effect of the illumination from the upper source 25. That is, in most cases, satisfactory performance may be maintained by allowing the upper light source 25 to continuously illuminate the upper surface of the superimposed masks and interrupting illumination from the lower source 23. When light from the lower source is interrupted, only the image 19A′ will appear upon the screen of the monitor 29. However, when illumination from the lower source 23 is allowed to pass up through the superimposed masks it overcomes the effect of the upper light source 25 and both of the images 14A′ and 19A′ will appear on the screen monitor 29. Interruption of light from the lower source 23 will thereby result in the identically "flicker effect" described above as an indication of misalignment.

When the first two opaque areas 14A and 19A have been inspected for alignment the movable stage 12 is systematically stepped in both the X and Y directions (by means not shown) to inspect all the remaining opaque areas on the two masks.

The technique shown and described above in connection with FIG. 1 was illustrated by using a pair of symmetrical masks. That is, each of the masks has an identical appearance when viewed from either the back or the front surfaces. In FIG. 1, the upper mask 10 is inverted to be face to face with the lower mask 16 so that the surfaces carrying the opaque areas 14 and 19 are adjacent and separated only by the layer of light selective material 15. An additional problem in mask inspection is introduced when the masks being inspected are nonsymmetrical and therefore, may not be inverted so that they lie face to face during the inspection process.

Figure 2:
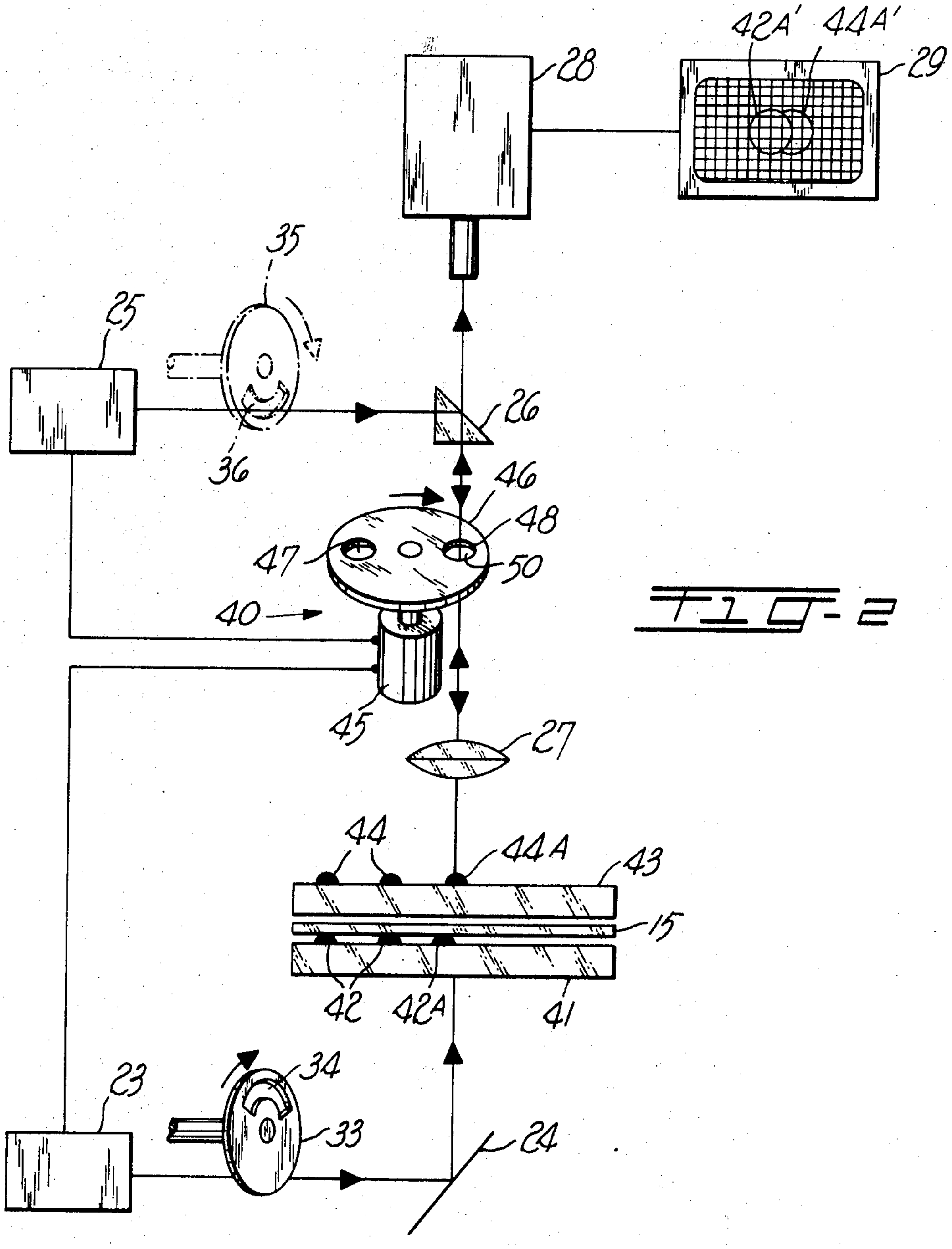
FIG. 2 is a system for inspecting a nonsymmetrical mask employing a first technique to compensate for focusing through the thickness of the mask.

As shown in FIG. 2, the inspection problem with nonsymmetrical masks arises from the fact that the upper mask 43 has a finite thickness so that when the upper and lower light sources 25 and 23 are alternately interrupted the focal length of the camera 28 must change in order to alternately focus upon the opaque areas 44A and then 42A. In order to compensate for the necessity to change focal lengths due to the thickness of the test mask 43, a focal length compensator 40 is added to the apparatus shown in FIG. 1.

The compensator 40 (FIG. 2) comprises a motor 45 which is connected to a rotatable disc 46. Apertures 47 and 48 are formed in opposite sides of the disc 46. One of the apertures 47 is open and the other aperture 48 is filled with a layer focus compensating material 50 comprising a substance having the same thickness and light transmissive characteristics as the test mask 43. The rotation of the motor 45 is synchronized with the interruption of illumination from the upper and lower light sources 25 and 23, so that when illumination comes from the lower source 23, alone, the open aperture 47 is in alignment with the optical path of the camera 28. When illumination comes from the upper source 25, alone, the aperture 48, having the focus compensating material 50 is in alignment with the camera 28.

Initially, the camera 28 is focussed upon the lower opaque area 42A through the open aperture 47. When it is desired that the camera 28 view, and be in focus with, the upper opaque area 44A the optical compensating material in the aperture 48 is in alignment with the optical path of a camera 28 positioning the focus compensating material 50 to effectively change the focal length of the camera. The result, is that a clearly focused image of the lower opaque area 42A′ combined with a slightly unfocused image of the upper opaque area 44A′ alternates with a clearly focused image of the upper opaque area 44A′, alone, upon the screen of the monitor 29. Mask misalignment results in a "flicker effect" just as described in connection with FIG. 1 above.

Figure 3:
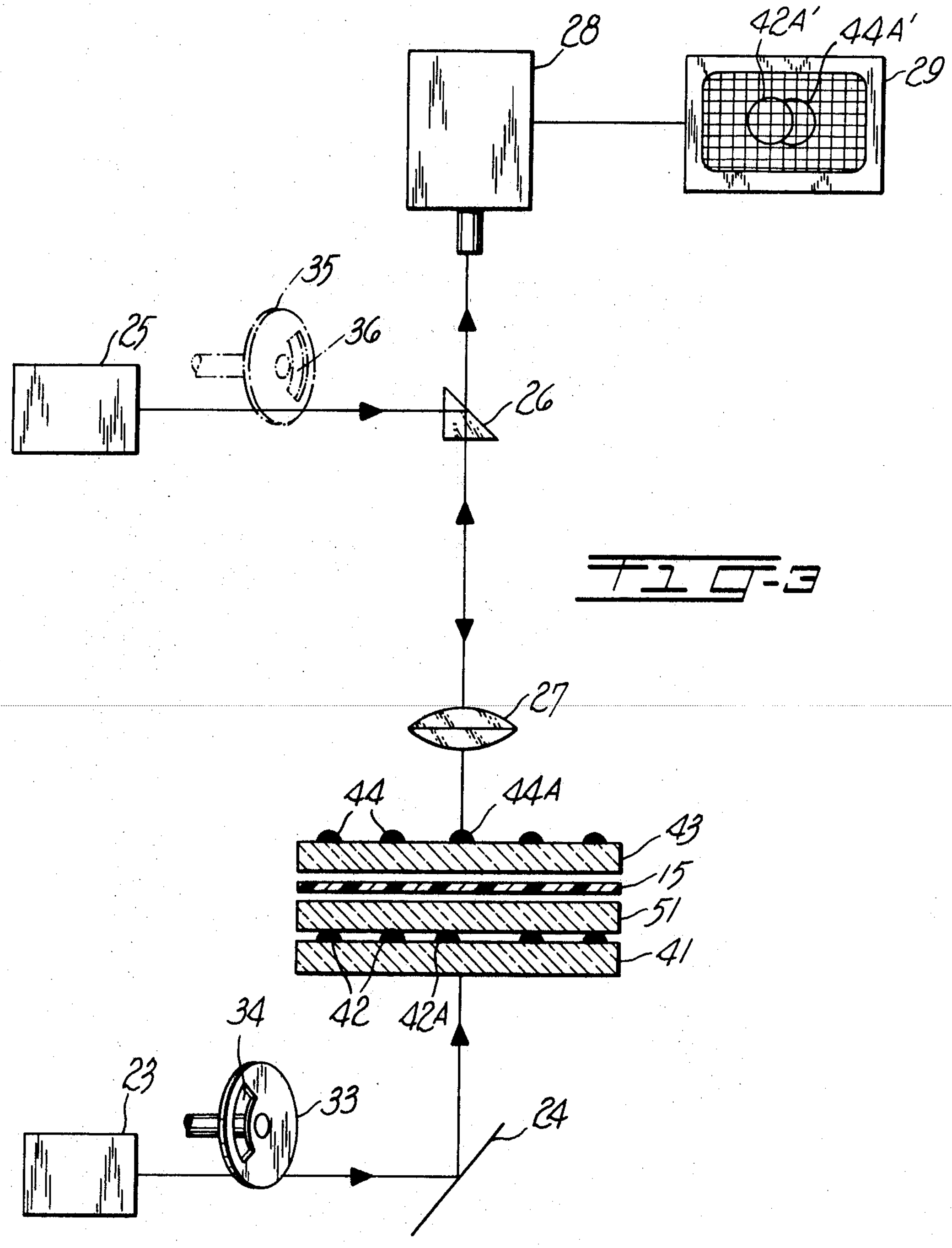
FIG. 3 is a system for inspecting a nonsymmetrical mask employing a second technique to compensate for focusing through the thickness of the mask.

In some situations, vibrations from the rotating motor 45 of the optical compensator 40 are undesirable. In these situations a second technique depicted in FIG. 3 may be used in the inspection of nonsymmetrical masks. In FIG. 3, a layer 51 of optical compensating material is interposed between the lower standard mask 41 and the layer of light selective material 15. The layer of material should be approximately the same thickness as the upper mask 43 and have the same light transmissive characteristics. Generally, an unpatterned glass mask substrate may be used. In the alternative, an additional interposed layer of light selective material or the interposed compensating layer 51 may have grid lines formed on one surface so that a grid pattern will be displayed on the screen of the monitor. This alternative will compensate for distortions in the optical system, permitting the viewer to accurately ascertain the degree of variations in the visually displayed opaque areas 42A′ and 44A′ on the screen.

Initially, the camera 28 is focused upon the layer of light selective material 15. When the superimposed masks are illuminated by the upper light source 25, the camera 28 views a "reflection" of the undersurface of the upper opaque area 44A in the "mirror-like" surface of the light selective material 15. This means that, in effect, the light entering the camera 28 passes through the thickness of the test mask 43 twice, once going toward the light selective material 15 and once returning to the camera 28. When the superimposed masks are illuminated by the lower light source 23 the light passes, after leaving the lower opaque area 42A, up through the optical compensating layer 51 through the layer of light selective material 15 and through the test mask 43. The "optical distance" to the lens of camera 28 is the same as the distance when the masks are illuminated by the upper light source 25 alone. That is, focusing the camera 28 on the light selective layer 15 enables the camera 28 to view a "virtual image" of the upper opaque area 44A in the same plane as the lower opaque area 42A. The technique of focal compensation illustrated in FIG. 3 results in sharply focused images 42A′ and 44A′ appearing upon the screen of the monitor 29 so that mask misalignment may be accurately evaluated.

Figure 4:
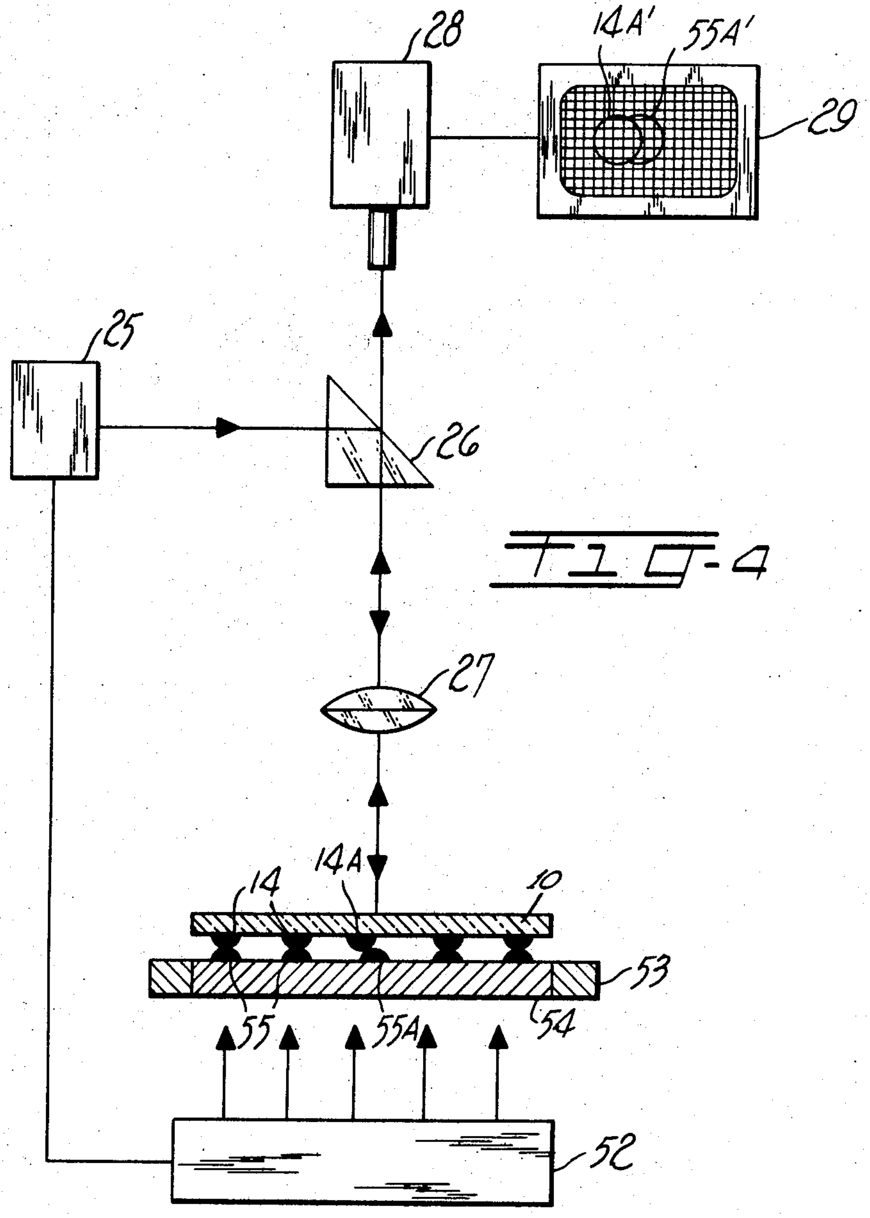
FIG. 4 is a diagrammatic view of a system for inspecting the conformity of the pattern on a semiconductive wafer with the pattern on a photographic mask.

The present mask inspection technique may be used to compare treated areas on a semiconductor slice with a desired pattern on a photographic mask. As shown in FIG. 4, a semiconductor wafer 54 having treated areas 55 thereon is mounted in a frame 53. For example, the treated areas 55 may comprise opaque, gold plate lead connections. A mask 10 having a pattern of opaque areas 14 thereon, which is desirably the same pattern as the treated areas 55 is superimposed upon the wafer 54. A source of infrared radiation 52 is located beneath the wafer 54 to direct radiation up through the wafer and mask combination. Since silicon is transparent to radiation of a wave length more than approximately 1.1 microns and germanium is transparent to wave lengths more than approximately 1.6 microns, the infrared radiation from the source 52 penetrates both the wafer 54 and the mask 10 and results in a superimposed image of both the lower treated area 55A and the upper opaque area 14A in the optical path of an infrared television camera 28 using a vidicon which has a spectral response down to light wavelengths of 2.2 microns. Infrared illumination from the source 52 is alternated with visible illumination from an upper light source 25. When the infrared light 52 is interrupted and the visible light source 25 is energized the television camera 28 views only the opaque area 14A, because the visible light cannot penetrate the semiconductor wafer. A layer of light selective material, as shown in FIGS. 1–3, may be placed between the mask and the wafer when required. The resulting alternation of the sources 52 and 25 results in alternate images 55A′ and 14A′ together and 14A′ alone appearing on the screen of the monitor 29. In this manner the pattern of treated areas 55 on the wafer 54 are inspected and compared to the pattern of opaque areas 14 on the surface of the standard mask 10. Misalignment results in a "flicker effect" as described in connection with FIG. 1. Although the wafer inspection technique of FIG. 4 has been described in connection with a symmetrical mask, nonsymmetrical patterns on semiconductor wafers may be inspected by using the techniques shown and described in connection with FIG. 2 or 3.

An additional feature which may be included in the mask inspection system shown in FIGS. 1–4 is that of a multicolor image display to aid in detecting mask misalignment. A multicolor cathode ray tube may be utilized such as the Multicolor Display Tube SC–4827 manufactured by the Sylvania Corp. of Seneca Falls, N.Y. The tube has two superimposed layers of phosphor material upon the display screen. The activation of one layer produces a red display and the activation of the other layer produces a green display. Either layer may be selectively activated by applying a required potential to a control grid. When the multicolor tube is used in the monitor 29, the activation of the control grid is synchronized with illumination by either the upper or lower light source 25 or 23. A red and then a green image is alternately displayed on the monitor screen permitting easier detection of the "flicker effect." If the interruption rate is increased, the superimposed portions of the image will appear yellowish and the nonsuperimposed portions of the images will appear in green and red.

It will be noted that in all the foregoing systems the optics utilized in positioning the masks and interposed layers results in an optical system wherein the opaque areas of the respective masks lie in substantially the same focal plane, thus leveling those systems to high amplification (magnification) of the viewed opaque areas.

It is to be understood that the above-described embodiments are simply illustrative of the invention and that many other embodiments can be devised without departing from the scope and spirit of the invention.

What is claimed is:

1. A method of visually displaying the relationship between a pair of objects;

generating a first optical display of a first of said objects;

generating a second composite optical display of said first and second objects with the first object in the second display being superimposed on the area occupied by said first optical display; and interrupting the second optical display at a rate to present a "flicker" effect to the second display to indicate the relationship of said second object to said first object.

2. In a method of ascertaining the relative positions of a pair of opaque indicia formed on a pair of transparencies;

abutting the transparencies against an interposed sheet of material characterized in the ability to transmit light impinged in a first direction and to reflect light impinged in a second direction;

alternately impinging light onto said exposed surfaces of said transparencies in said first and second directions;

producing a first visual display of the first indicia in accordance with the light reflected from the interposed sheet of material; and producing a second visual display of the first and second indicia in accordance with the light passed through said interposed sheet of material with the visual display of said first indicia being superimposed on the area occupied by the first indicia during the first visual display.

3. A system for measuring the degree of deviation in position of opaque areas on one surface of a first photographic mask from the position of opaque areas on one surface of a second photographic mask, comprising:

means mounting said masks in a superimposed relationship with the surface of said first mask having opaque areas thereon adjacent the surface of said second mask having opaque areas thereon;

a layer of light selective material disposed between the adjacent surfaces of said masks for reflecting and transmitting light;

a television camera optically aligned with a selected set of opaque areas on said masks;

a monitor connected to said television camera for visually displaying the image viewed by said camera;

first means for illuminating said superimposed masks from the same side as said camera, the illumination being reflected by said layer of light selective material to display on said monitor an image the opaque area of said first mask alone;

second means for illuminating said superimposed masks from the opposite side of said camera, the illumination being transmitted through said layer of light selective material to display on said monitor a composite image the opaque areas of said first and second masks; and means for alternately interrupting the illumination from said first and second illuminating means at a rate to create a flicker effect on the display screen of said monitor, the degree of flicker being indicative of the degree of deviation in position of the opaque areas on said first mask from the position of the opaque areas on said second mask.

4. A system for measuring the degree of deviation in position of opaque areas on one surface of a first photographic mask from the position of opaque areas on one surface of a second photographic mask as set forth in claim 3, in which:

said layer of light selective material is composed of polyethyleneterephthalate.

5. In a method of checking the alignment of opaque spots formed on the same side of a pair of transparent masks;

abutting the masks against a sheet of light selective material having characteristics that reflect light when the light is impinged on a first side and transmits light when the light is impinged on a second side;

impinging first light on said first side to reflect an image of said first opaque spot;

impinging second light on said second side to transmit an image of said first and second opaque spots;

alternately interrupting said first and second lights;

imposing a transparent member into the path of said first light, said member having a thickness equal to the thickness of said first transparent mask; and superimposing said images to produce a composite image wherein the first opaque spot appears as a constant image and the second opaque spot appears as a flickering image to visually indicate the disparity in alignment of the spot.

6. A method of checking the alignment of opaque spots formed on the same side of a pair of transparent masks, comprising:

placing a layer of transparent material adjacent the surface of the first mask having opaque spots thereon, said transparent material having a thickness equal to the thickness of the second mask of said pair of masks;

abutting said layer of transparent material against one surface of a sheet of light selective material and abutting the surface of the second mask not having opaque spots thereon against the other surface of said sheet of light selective material, said light selective material having characteristics that reflect light when the light is impinged on a first surface and transmit light when the light is impinged on a second surface;

impinging a first beam of light on the first side of said superimposed masks to reflect an image of the opaque spot on said second mask, the reflected image of said spot appearing to be in the same plane as the opaque spot on said first mask;

impinging a second beam of light on the second side of said superimposed masks to transmit a composite image of the opaque spots on said first and second masks;

alternately interrupting said first and second light beams; and superimposing said images to produce a composite image wherein the first opaque spot appears as a constant image and the second opaque spot appears as a flickering image to visually indicate the disparity in alignment of the spots.

7. A method of checking the alignment of opaque spots on the surface of a semiconductive wafer with opaque spots on a transparent mask, comprising:

abutting the surface of the mask against the surface of the semiconductive wafer having opaque spots thereon;

impinging infrared light on the surface of said semiconductive wafer opposite the surface having opaque spots thereon to penetrate the semiconductive material and transmit a composite image of the opaque spots on said mask and said semiconductive wafer;

impinging visible light on the surface of said mask to reflect an image of the opaque spot on the surface of said mask;

converting the transmitted and reflected images to visual displays; and alternately interrupting said visible light and said infrared light to superimpose said displays and produce a composite image wherein the opaque spot on said mask is displayed as a constant image and the opaque spot on said semiconductive wafer is displayed as a flickering image to visually indicate the disparity in the alignment of the spots.

8. A method of checking the alignment of opaque spots on the surface of a semiconductive wafer with opaque spots on a transparent mask, as set forth in claim 7 which also comprises:

interposing a layer of light selective material between the mask and the semiconductive wafer, said light selective material having characteristics that reflect light when the light is impinged on a first surface and transmits light when the light is impinged on a second surface.

9. A method of measuring the degree of deviation in position of opaque areas on one surface of a first photographic mask from the position of opaque areas on one surface of a second photographic mask, comprising:

superimposing the surface of said first photographic mask having opaque areas thereon over and adjacent to the surface of said second photographic mask having opaque areas thereon;

interposing a layer of light selective material between the adjacent surfaces of said masks, said material having a characteristic to reflect light when impinged upon one surface and to transmit light when impinged upon the opposite surface;

generating a visual image of the appearance of said superimposed masks as viewed from a first side on a display screen;

impinging light upon the first side of said superimposed masks, said light being reflected by said layer of light selective material to display an image of the opaque areas on said first mask;

impinging light on the second side of said superimposed masks, said light being transmitted by said layer of light selective material to display a composite image of the opaque areas on both said first and said second masks; and alternately interrupting the illumination on said first and second surfaces of said superimposed masks at a rate to create a flicker effect in said generated images, the degree of flicker being indicative of the degree of deviation in position of the opaque areas on said first photographic mask from the position of opaque areas on the second photographic mask.

10. A method of displaying the variation in alignment of first indicia on a first sheet with second indicia on a second sheet, which comprises:

abutting the nonindicia bearing side of the first sheet against a layer of light selective material;

abutting a layer of light-compensating material against said light selective material, said layer of light-transmitting material having the same effect on light transmitted therethrough as the effect on light transmitted through the first sheet;

abutting the second sheet with the indicia against the layer of light-compensating material;

alternately impinging light on the indicia bearing side of the first sheet, and then on the nonindicia bearing side of the second sheet;

generating a first visual image of the first indicia from the light reflected by the light selective material; and generating a second composite visual image of the first and second indicia from the light transmitted through all said sheets and layers with the images of the first indicia in the composite image superimposed on the area occupied by the first images during the generation of the first images, whereupon variations in alignment appears as flickering portions of the second composite image.

11. A method of ascertaining the alignment of first indicia on a first sheet with second indicia on a second sheet, which comprises:

abutting the first and second sheets to position the respective indicia in overlying relationship;

applying control signals to alternately activate distinct color layers of material formed on a display screen of a television viewer;

alternately generating a first visual signal indicative of the first indicia, and then generating a second visual signal indicative of a composite image of the first and second indicia; and alternately applying a first visual signal with a first control signal to activate a first color layer to present a display of the first indicia in a first discrete color, and then applying a second visual signal with a second control signal to activate a second color layer to present a display of the composite first and second indicia in a second discrete color.

References Cited

UNITED STATES PATENTS

| | | | |
|---|---|---|---|
| 2,423,370 | 7/1947 | Butscher | 356—168 |
| 2,460,350 | 2/1949 | Hinman | 356—166 |
| 3,039,239 | 6/1962 | Banko | 356—166X |
| 3,114,797 | 12/1963 | Williams | 356—168 |

RONALD L. WIBERT, Primary Examiner

P. K. GODWIN, Assistant Examiner

U.S. Cl. X.R.

350—165, 157, 168; 250—216